United States Patent [19]

Bales

[11] Patent Number: 5,786,731
[45] Date of Patent: Jul. 28, 1998

[54] CLASS AB COMPLEMENTARY TRANSISTOR OUTPUT STAGE HAVING LARGE OUTPUT SWING AND LARGE OUTPUT DRIVE

[75] Inventor: James E. Bales, Fort Collins, Colo.

[73] Assignee: National Semiconductor Corporation, Santa Clara, Calif.

[21] Appl. No.: 623,655

[22] Filed: Mar. 29, 1996

[51] Int. Cl.$^6$ .................................................. H03F 3/30
[52] U.S. Cl. ................................................ 330/267; 330/265
[58] Field of Search ........................... 330/262, 263, 330/267, 268, 265

[56] References Cited

U.S. PATENT DOCUMENTS

| 4,570,128 | 2/1986 | Monticelli | 330/267 |
| 4,814,723 | 3/1989 | Botti | 330/267 X |
| 5,442,320 | 8/1995 | Kunst et al. | 330/267 |

FOREIGN PATENT DOCUMENTS

| 2646386 | 4/1978 | Germany | 330/263 |
| 1254579 | 8/1986 | U.S.S.R. | 330/267 |

OTHER PUBLICATIONS

Smith, Doug, Koen, Mike, Witulski, Arthur, F., "Evolution of High-Speed Operational Amplifer Architectures", IEEE Journal of Solid-State Circuits, vol. 29, No. 10, Oct. 1994.

Primary Examiner—James B. Mullins
Attorney, Agent, or Firm—Limbach & Limbach L.L.P.

[57] ABSTRACT

A complementary Class AB output stage including a Class AB complementary common emitter quiescently biased by means of current mirrors and a Class AB complementary emitter follower circuit having its emitters connected to the common emitter stage outputs and its collectors connected to the base terminals of the common emitter transistors thus achieving large output swing and large output drive current with very low quiescent current in the common emitter portion of the circuit.

6 Claims, 5 Drawing Sheets

CLASS AB COMPLEMENTARY TRANSISTOR OUTPUT STAGE HAVING LARGE OUTPUT SWING AND LARGE OUTPUT DRIVE

FIELD OF THE INVENTION

The invention pertains to a class AB output stage. More particularly, the invention pertains to a class AB complementary transistor output stage for an operational amplifier or the like.

BACKGROUND OF THE INVENTION

Operational amplifiers are one of the basic building blocks of integrated circuits. Typical design goals of high-performance operational amplifiers include the achievement of (1) a large output voltage swing and (2) large output current drive accompanied by (3) low quiescent operating current. However, these three objectives are in mutual conflict, particularly in the high-speed complementary bipolar processes where high beta and good saturation characteristics are traded off with device speed. Generally, high-performance operational amplifiers comprise three main portions, namely, an input buffer, a gain stage, and an output buffer. The design of the output buffer typically is the most significant element affecting the output voltage swing, output current drive and quiescent operating current.

There are a large number of known operational amplifier and output stage designs. One class of devices which is of particular interest to the present specification is complementary bipolar operational amplifiers with class AB output stages. A review of various modern high-speed operational amplifier architectures can be found in D. Smith, M. Koen, A. F. Witulski, *Evolution of High-Speed Operational Amplifier Architectures*, IEEE Journal of Solid-State Circuits, Vol. 29, No. 10 (October 1994).

One common output stage design for an operational amplifier is a four transistor bipolar output buffer arranged in an emitter follower architecture. FIG. 1 illustrates one such architecture, sometimes referred to as a double buffer. The circuit shown in FIG. 1 has the following limits:

$$I_{source}(max) = \beta_{NPN} I_1$$

$$I_{sink}(max) = \beta_{PNP} I_2$$

$$V_{max} = V_{CC} - V_{BE,Q3} - V(I_1 \text{ compliance})$$

$$V_{min} = V_{EE} + V_{BE,Q4} + V(I_2 \text{ compliance})$$

Since the β of high frequency bipolar transistors is relatively low, particularly at cold temperatures, current gain is relatively low. Accordingly, if large output current drive is necessary, $I_1$ and $I_2$ must be large current sources.

In many architectures, the low-gain problem is solved by adding another emitter follower stage, resulting in a triple buffer, such as illustrated in FIG. 2. The triple buffer circuit of FIG. 2 offers:

$$I_{source} = I_1 \cdot \beta^2_{NPN}$$

$$I_{sink} = I_2 \cdot \beta^2_{PNP}$$

This circuit provides improved output current capability at the cost of reduced voltage swing capability and the additional quiescent current requirements of an extra stage. Both the positive and negative swings are reduced by an additional $V_{BE}$. Further, the intermediate stage requires bias current and introduces additional phase shift.

An alternative output stage architecture is disclosed in U.S. Pat. No. 4,570,128 of Dennis M. Monticelli, owned by the assignee of the present application and incorporated herein by reference. FIG. 3 illustrates an output stage in accordance with the Monticelli patent. In accordance with that patent, a complementary Class AB common emitter output stage circuit is quiescently biased by means of current mirrors. In this manner, the bias is controlled mainly by ratioed geometric elements. The output transistors are biased by unity gain common base drivers. This design allows for an output voltage swing from close to the rail potential of the emitter of the NPN output transistor to close to the rail potential of the emitter of the PNP output transistor.

It is an objective of the present invention to provide an improved output stage.

It is another objective of the present invention to provide an improved output stage for an operational amplifier.

It is a further objective of the present invention to provide an improved Class AB output buffer for an operational amplifier having a large output swing and large output drive, but low quiescent current requirements.

It is yet another objective of the present invention to provide an output buffer for an operational amplifier with significantly increased output current capabilities to that of the prior art.

SUMMARY OF THE INVENTION

The invention is a class AB complementary transistor output stage comprising a Class AB complementary common emitter and a Class AB complementary emitter follower buffer circuit having its voltage outputs connected to the common emitter output and its current outputs coupled to the base terminals of the common emitter transistors. In a preferred embodiment, the common emitter circuit is quiescently biased by current mirrors so that the bias is controlled mainly by ratioed geometric elements.

In operation, the in-phase signal currents from the emitter follower collectors are applied to the base terminals of the common emitter output transistors. The voltage outputs of the emitter follower and common emitter circuits are connected together. This increases output current drive capability by a factor of beta relative to the emitter follower operating alone, but does not substantially increase quiescent operating current. This architecture provides near unity voltage gain of the emitter follower circuit and output impedance reduction by a factor of β due to the current gain of the common emitter transistors. The output voltage swing is limited by the emitter follower circuit. Accordingly, the invention provides large output voltage swing and large output current drive at low quiescent current requirements.

The present invention is particularly suitable for use as an output stage for a current-feedback operational amplifier or a voltage-feedback operational amplifier or as a stand alone buffer circuit.

3

Figure 5:
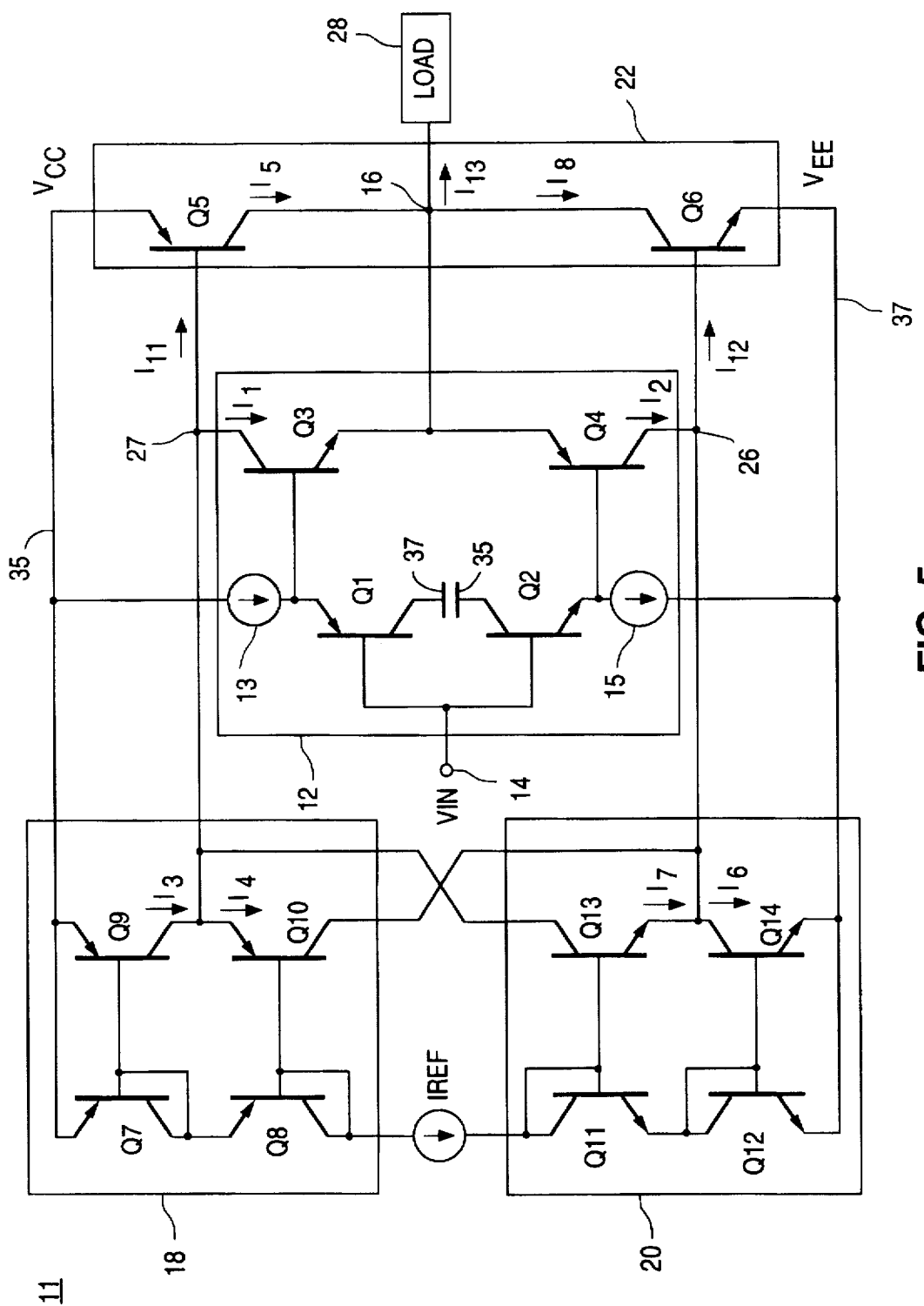

FIG. 5 is a schematic diagram of an actual implementation of an output stage according to a preferred embodiment of the present invention.

Figure 6:
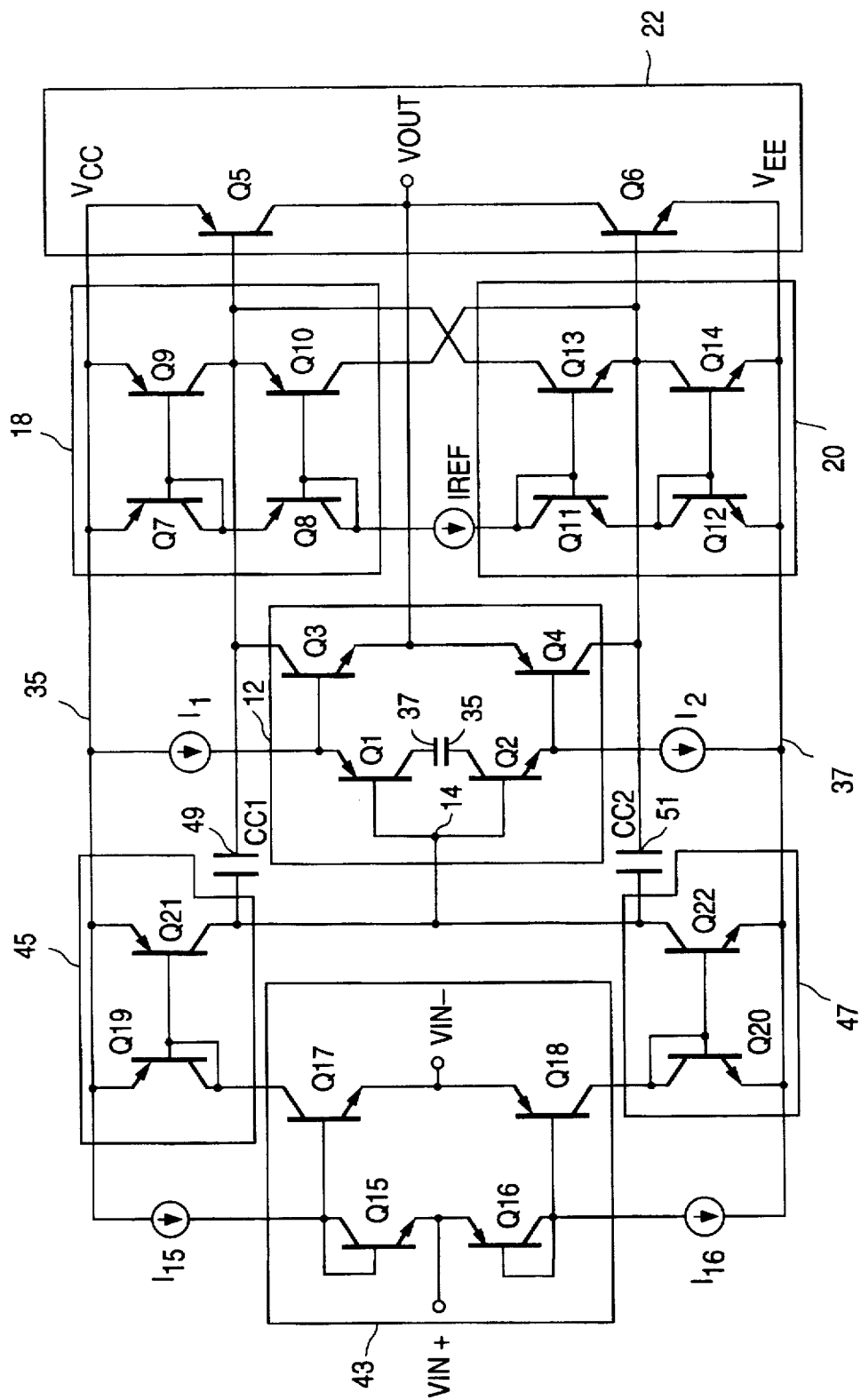

FIG. 6 is a schematic of a current feedback operational amplifier embodying an output stage in accordance with the present invention.

DETAILED DESCRIPTION OF A PREFERRED EMBODIMENT OF THE INVENTION

Figure 4:
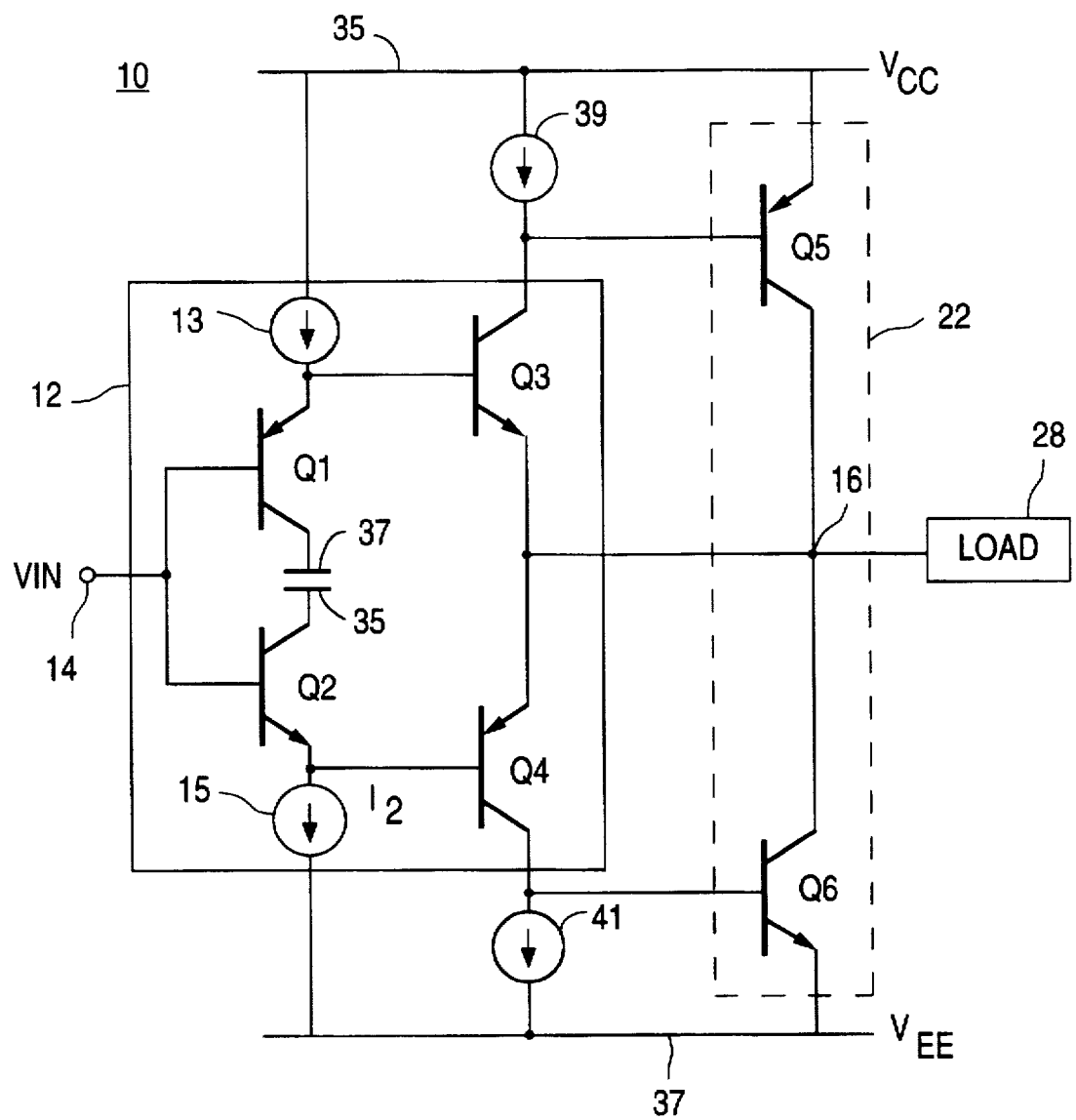
FIG. 4 is a schematic diagram illustrating the concept of the output stage according to a preferred embodiment of the present invention.

FIG. 4 is a schematic diagram of a Class AB output stage 10 in accordance with a preferred embodiment of the present invention. The circuit can be embodied in an operational amplifier or can be used as a stand alone buffer circuit. The output stage 10 includes an emitter follower circuit 12. The input signal from the main amplification stage of the operational amplifier is applied to terminal 14 of the emitter follower portion 12. The voltage output of the amplifier to load 28 is at node 16. The circuit comprises; (1) a class AB common emitter output stage 22 comprising transistors Q5 and Q6 and (2) a unity gain four transistor emitter follower circuit 12 having its voltage outputs connected to the common emitter stage output (node 16) and its current outputs connected to the bases of the common emitter output transistors Q5 and Q6.

The current sources 39 and 41 source/sink the quiescent current of the emitter followers Q3 and Q4. All of the signal current in the collectors of the emitter followers Q3 and Q4 is available to drive the bases of the common emitter output transistors Q5 and Q6. This arrangement results in an increase in current gain by a factor of β over the emitter follower 12 operating alone, where β is the beta value of transistors Q5 and Q6.

The circuit illustrated in FIG. 4, however, has shortcomings because temperature and process variations in β and Early voltage results in wide variations in the quiescent current of the common emitter output devices Q5 and Q6. It is desirable, therefore, to control the quiescent current of the common emitters Q5 and Q6 without sacrificing the current gain provided by Q5 and Q6.

FIG. 5 illustrates a practical embodiment of the invention which achieves the above-stated goals. The circuit 11 can be fabricated using any complementary bipolar fabrication process. In the particular embodiment shown in FIG. 5, transistors Q1, Q4, Q5, Q7, Q8, Q9 and Q10 are PNP devices and transistors Q2, Q3, Q6, Q11, Q12, Q13 and Q14 are NPN devices.

The common emitter output stage 22 comprises a first transistor Q5 having it collector coupled to output node 16 and its emitter coupled to the $V_{CC}$ power rail 35 and a second transistor Q6 having its collector coupled to output node 16 and its emitter coupled to the $V_{EE}$ power rail 37. The emitter follower circuit 12 comprises transistors Q1, Q2, Q3 and Q4 and current sources 13 and 15. Emitter follower transistors Q1 and Q2 have their bases coupled to the input terminal 14. The emitters of transistors Q1 and Q2 are coupled through constant current sources 13 and 15, respectively, to the $V_{CC}$ power rail 35 and the $V_{EE}$ power rail 37, respectively, and to the bases of transistors Q3 and Q4, respectively. Accordingly, the emitter follower portion 12 operates as an emitter follower. The collectors of transistors Q3 and Q4 are coupled respectively to nodes 27 and 26. The emitters of transistors Q3 and Q4 are coupled to the current output node 16.

Current mirror 18 comprises transistors Q7, Q8, Q9 and Q10. The junction between the collector of Q9 and the emitter of Q10 is coupled to node 27. Current mirror 20 comprises transistors Q11, Q12, Q13, and Q14 and the junction between the emitter of transistor Q13 and the collector of transistor Q14 is coupled to node 26. The current mirror 18 maintains the base of current mirror transistor Q10 at a voltage that is two $V_{BE}$ below the $V_{CC}$ voltage supply rail 35. Likewise, the current mirror 20 maintains the base of current mirror transistor Q13 at a voltage that is two $V_{BE}$ above the $V_{EE}$ voltage supply rail 37. This biasing arrangement causes each of transistors Q10 and Q13 to operate as a common base unity gain voltage level shifter.

In operation, the input voltage is applied at node 14. When the input voltage increases, the voltage at the bases of transistors Q1 and Q2 increases. Since transistors Q1, Q2, Q3 and Q4 are coupled as an emitter follower, the voltages at the bases of transistors Q3 and Q4 also increase. Further, the voltages at the emitters of Q3 and Q4 approximately follow the voltages at the bases of Q3 and Q4, respectively. The result is an increase of the voltage potential at output node 16. Accordingly, current $I_{13}$ to the load 28 increases. The increased current flowing out of node 16 into the load 28 is supplied through transistor Q3. Thus, current $I_1$ into the collector of transistor Q3 from node 27 increases. Since the bases of transistors Q3 and Q4 are driven by emitter followers Q1 and Q2 and since the emitters of Q3 and Q4 are coupled together, the increase in the base emitter voltage of Q3 associated with the increased current through Q3 is offset by a corresponding decrease in the base emitter voltage of Q4 and decreased current in Q4. Accordingly, current $I_2$ from the collector of transistor Q4 into node 26 also decreases.

With respect to node 27, current $I_3$ at the collector of transistor Q9 is constant. In particular, the diode coupled transistors Q7 and Q8 of current mirror 18 place constant voltages at the bases of transistors Q9 and Q10. Since the emitter of transistor Q9 is also coupled to a constant voltage source, i.e., $V_{CC}$, the collector current $I_3$ of transistor Q9 is constant. With respect to node 26, the current $I_6$ through transistor Q14 is constant for the same reasons discussed above with respect to current $I_3$ in transistor Q9.

Accordingly, the decrease in current $I_2$ into node 26 causes an increase in the current $I_7$ at the emitter of transistor Q13.

Since $I_3$ is constant, as $I_1$ increases under the mechanism described above, changes must occur in currents $I_4$, $I_9$ and $I_{11}$ to balance current flow in the node 27 (since total current flow into a node must always remain zero). Further, because of the balanced complementary nature of the circuit design, any increase in current $I_4$ out of node 27 and into node 26 is approximately equal to any decrease in current $I_9$ out of node 27 and into the collector of transistor Q13. Accordingly, any increase in the signal current $I_1$ into the collector of the emitter follower device Q3 out of node 27 is essentially wholly supplied by an equal decrease in the base current $I_{11}$ of output transistor Q5.

The above-described action increases the forward bias of transistor Q5, causing the collector current $I_5$ through transistor Q5 into output node 16 to increase.

Likewise, the decrease in the signal current $I_2$ from the collector of the emitter follower device Q4 into node 26 decreases the base current $I_{12}$ of output transistor Q6. This action decreases the forward bias of transistor Q6. Accordingly, current $I_8$ from output node 16 into the collector of transistor Q6 decreases.

Thus, the circuit 11 of FIG. 5 sources more current into the output node 16 through transistor Q5 and sinks less current from output node 16 through transistor Q6 as the input voltage at node 14 increases. The overall effect is to increase current to the load 28 as the input voltage increases.

It should be clear to those of skill in the related arts that the inverse relationship also holds, that is, the current to the load 28 decreases as the input voltage at node 14 decreases. For example, if the voltage at input node 14 decreases, the net result is the sinking of additional current via $I_8$ and transistor Q6 from the output node 16 and the sourcing of less current to the output node 16 via $I_5$ and transistor Q5. Particularly, as the voltage at node 14 decreases, the voltages at the bases of each of transistors Q1, Q2, Q3 and Q4 decrease in response thereto. Thus, current $I_1$ through transistor Q3 decreases, while current $I_2$ through transistor Q4 increases. Likewise, the voltages at the bases of transistors Q5 and Q6 (nodes 27 and 26, respectively) will increase. The increased voltage at the base of transistor Q5 tends to reduce the forward bias of transistor Q5, thus decreasing current $I_5$ through the transistor into node 16. The increased base voltage at transistor Q6, on the other hand, increases the forward bias of that transistor, thus increasing the current $I_8$ which is being sunk from the output node 16. Accordingly, as the input voltage at node 14 decreases, current $I_5$ into the output node 16 decreases, while current $I_8$ which is sunk out of node 16 increases.

This circuit improves the output current drive capability by a factor of approximately beta relative to the emitter follower operating alone.

Figure 1:
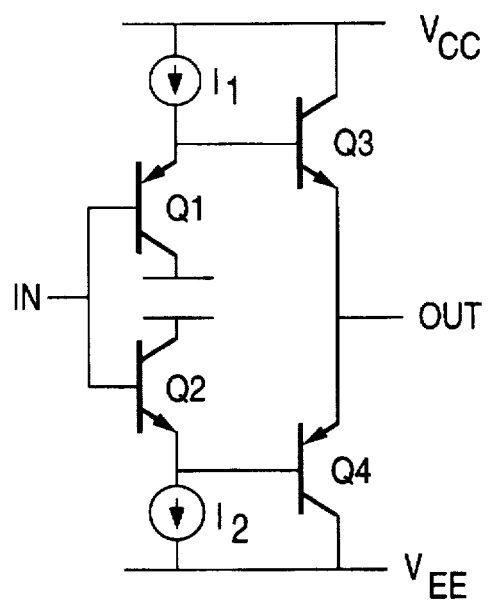
FIG. 1 is a schematic diagram of a complementary emitter follower double buffer operational amplifier output stage of the prior art.
Figure 2:
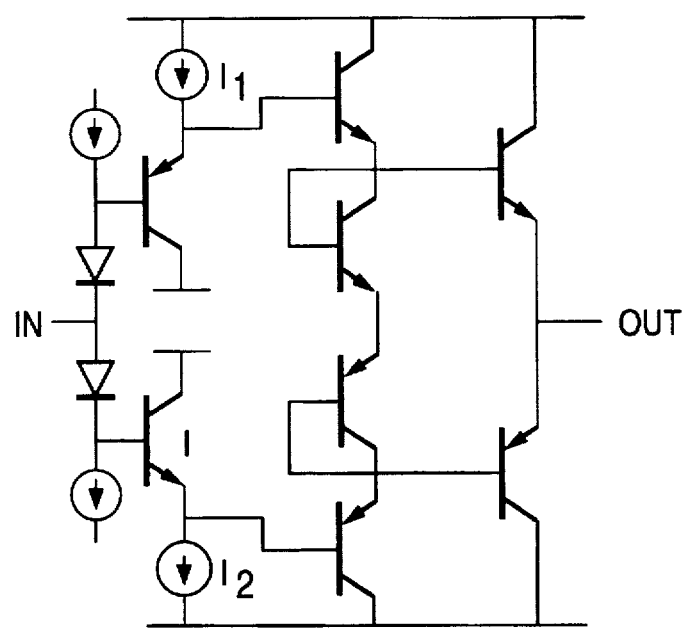
FIG. 2 is a schematic diagram of a complementary emitter follower triple buffer operational amplifier output stage of the prior art.
Figure 3:
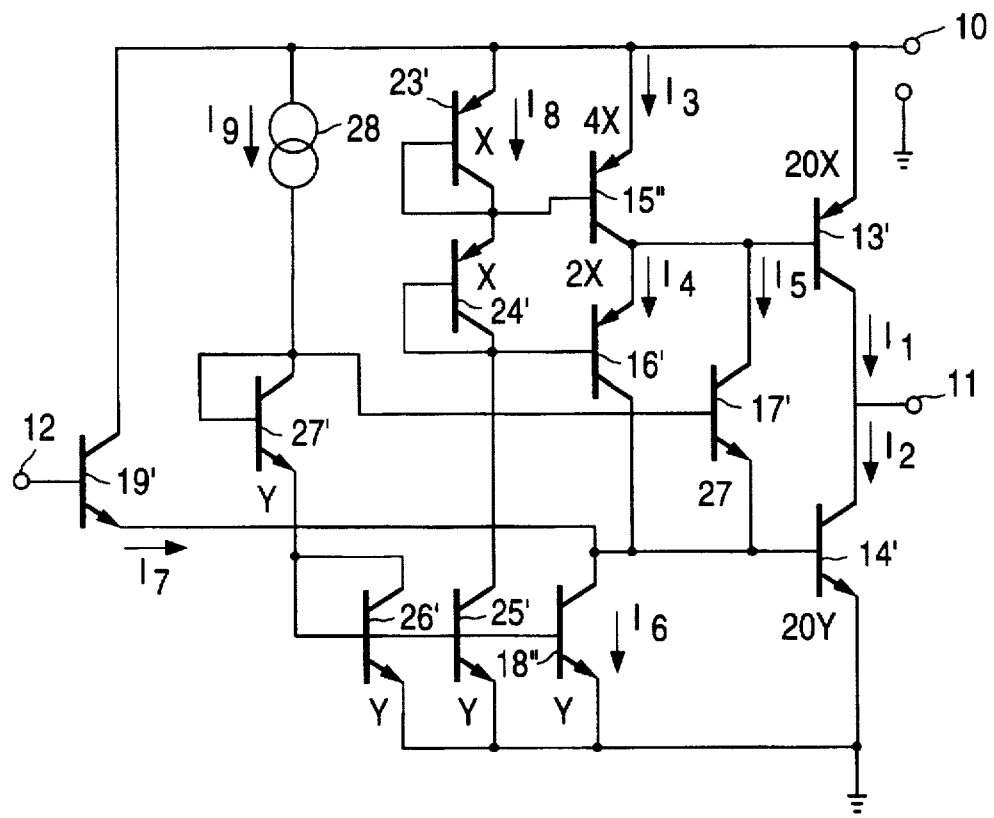
FIG. 3 is a schematic diagram of a complementary common emitter operational amplifier output stage of the prior art as disclosed in U.S. Pat. No. 4,570,128.

This closed feedback loop circuit configuration provides nearly unity voltage gain and a much lower output impedance than that of the prior art circuits of FIGS. 1, 2 and 3. Since this output stage is a closed feedback loop, however, additional compensation circuitry may be required to assure stability depending on the particular implementation (e.g., device sizes, quiescent current levels and fabrication process).

The output voltage swing is limited by the emitter follower 12 provided that the common emitter devices Q5 and Q6 do not reach saturation. The output current drive capability is β times greater than the output current capability of the circuits of FIG. 1, where β is the beta value of transistors Q5 and Q6.

This significantly improved output current drive capability is achieved with very low quiescent current requirements in the common emitter portion of the circuit.

In the above-disclosed embodiments of the invention, the emitter follower circuit 12 is a four transistor emitter follower. However, it should be understood by those of skill in the related arts that other emitter follower circuits can be employed, such as a single buffer emitter follower circuit.

FIG. 6 is a schematic diagram of a current feedback operational amplifier in accordance with the present invention. The common emitter output stage 22, the emitter follower portion 12, and the current mirrors 18 and 20 are substantially in accordance with the circuit shown in FIGS. 4 and 5. The input stage 43 is a complementary diode input emitter follower. The emitter follower collector currents drive complementary current gain mirrors 45 and 47. The gain mirror outputs are connected directly to the input node 14 of the output stage. Compensation capacitors 49 and 51 establish a single dominant pole for the overall amplifier and should be set to values which assure stability.

A computer simulation of this circuit yielded a theoretical linear output voltage swing to within approximately 0.8 volts of the power supply voltages at rails 35 and 37.

The output stage disclosed herein also is particularly suitable for use as the output stage of a voltage-feedback operational amplifier or as a stand-alone buffer circuit. The circuit, however, has broader applications and is not limited to the embodiments discussed herein.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. A complementary bipolar class AB output stage circuit comprising:

an input terminal configured to receive an input signal;

an output terminal for coupling to a load;

first and second voltage terminals for coupling to first and second fixed voltages, respectively;

first and second mirror current sources coupled to said first and second voltage terminals, respectively;

a PNP output transistor having an emitter terminal coupled to said first voltage terminal, a collector terminal coupled to said output terminal, and a base terminal coupled to said first mirror current source;

a NPN output transistor having an emitter terminal coupled to said second voltage terminal, a collector terminal coupled to said output terminal, and a base terminal coupled to said second mirror current source;

a first NPN buffer transistor having a collector terminal coupled to said base terminal of said PNP output transistor, an emitter terminal coupled to said output terminal, and a base terminal coupled to a first constant current source;

a first PNP buffer transistor having a collector terminal coupled to said base terminal of said NPN output transistor, an emitter terminal coupled to said output terminal, and a base terminal coupled to a first constant current sink;

a second PNP buffer transistor having a collector terminal coupled to said second voltage terminal, an emitter terminal coupled to said base terminal of said first NPN buffer transistor, and a base terminal coupled to said input terminal;

a second NPN buffer transistor having a collector terminal coupled to said first voltage terminal, an emitter terminal coupled to said base terminal of said first PNP buffer transistor, and a base terminal coupled to said input terminal;

a PNP common base feedback transistor having an emitter terminal coupled to said base terminal of said PNP output transistor, a collector terminal coupled to said base terminal of said NPN output transistor, and a base terminal coupled to a first source of bias voltage less than said first fixed voltage; and a NPN common base feedback transistor having an emitter terminal coupled to said base terminal of said NPN output transistor, a collector terminal coupled to said base terminal of said PNP output transistor, and a base terminal coupled to a second source of bias voltage greater than said second fixed voltage.

2. A method of providing a complementary bipolar class AB output stage circuit, said method comprising the steps of:

providing an input terminal configured to receive an input signal;

providing an output terminal configured for coupling to a load;

providing first and second voltage terminals configured for coupling to first and second fixed voltages, respectively;

providing first and second mirror current sources coupled to said first and second voltage terminals, respectively;

providing a PNP output transistor having an emitter terminal coupled to said first voltage terminal, a collector terminal coupled to said output terminal, and a base terminal coupled to said first mirror current source;

providing a NPN output transistor having an emitter terminal coupled to said second voltage terminal, a collector terminal coupled to said output terminal, and a base terminal coupled to said second mirror current source;

providing a first NPN buffer transistor having a collector terminal coupled to said base terminal of said PNP output transistor, an emitter terminal coupled to said output terminal and a base terminal coupled to a constant current source;

providing a first PNP buffer transistor having a collector terminal coupled to said base terminal of said NPN output transistor, an emitter terminal coupled to said output terminal and a base terminal coupled to a constant current sink;

providing a second PNP buffer transistor having a collector terminal coupled to said second voltage terminal, an emitter terminal coupled to said base terminal of said first NPN buffer transistor, and a base terminal coupled to said input terminal;

providing a second NPN buffer transistor having a collector terminal coupled to said first voltage terminal, an emitter terminal coupled to said base terminal of said first PNP buffer transistor, and a base terminal coupled to said input terminal;

providing a PNP common base feedback transistor having an emitter terminal coupled to said base terminal of said PNP output transistor, a collector terminal coupled to said base terminal of said NPN output transistor, and a base terminal coupled to a first source of bias voltage less than said first fixed voltage; and providing a NPN common base feedback transistor having an emitter terminal coupled to said base terminal of said NPN output transistor, a collector terminal coupled to said base terminal of said PNP output transistor, and a base terminal coupled to a second source of bias voltage greater than said second fixed voltage.

3. A complementary bipolar class AB output stage circuit comprising:

an input terminal for receiving an input signal;

an output terminal for coupling to a load;

first and second voltage terminals for coupling to first and second fixed voltages, respectively;

a PNP output transistor having an emitter terminal coupled to said first voltage terminal, a collector terminal coupled to said output terminal, and a base terminal coupled to a constant current source;

a NPN output transistor having an emitter terminal coupled to said second voltage terminal, a collector terminal coupled to said output terminal, and a base terminal coupled to a constant current sink;

a NPN buffer transistor having a collector terminal coupled to said base terminal of said PNP output transistor, an emitter terminal coupled to said output terminal, and a base terminal;

a PNP buffer transistor having a collector terminal coupled to said base terminal of said NPN output transistor, an emitter terminal coupled to said output terminal, and a base terminal;

means for coupling the input terminal to said base terminal of said NPN buffer transistor and to said base of said PNP buffer transistor;

a PNP common base feedback transistor having an emitter terminal coupled to said base terminal of said PNP output transistor, a collector terminal coupled to said base terminal of said NPN output transistor, and a base terminal coupled to a first source of bias voltage less than said first fixed voltage; and a NPN common base feedback transistor having an emitter terminal coupled to said base terminal of said NPN output transistor, a collector terminal coupled to said base terminal of said PNP output transistor, and a base terminal coupled to a second source of bias voltage greater than said second fixed voltage.

4. A complementary bipolar class AB output stage circuit comprising:

an input terminal configured to receive an input signal;

an output terminal for coupling to a load;

first and second voltage terminals for coupling to first and second fixed voltages, respectively;

a PNP output transistor having an emitter terminal coupled to said first voltage terminal, a collector terminal coupled to said output terminal, and a base terminal;

a NPN output transistor having an emitter terminal coupled to said second voltage terminal, a collector terminal coupled to said output terminal, and a base terminal;

a NPN buffer transistor having a collector terminal coupled to said base terminal of said PNP output transistor, an emitter terminal coupled to said output terminal, and a base terminal;

a PNP buffer transistor having a collector terminal coupled to said base terminal of said NPN output transistor, an emitter terminal coupled to said output terminal, and a base terminal;

means for coupling said input terminal to said base terminal of said NPN buffer transistor and to said base terminal of said PNP buffer transistor;

a first current mirror that includes a PNP common base feedback transistor having an emitter terminal coupled to said base terminal of said PNP output transistor, a collector terminal coupled to said base terminal of said NPN output transistor, and a base terminal coupled to a constant current sink, said first current mirror further including a first PNP mirror transistor having an emitter terminal, a collector terminal connected to said constant current sink, and a base terminal commonly connected to said collector terminal of said first PNP mirror transistor and to said base terminal of said PNP common base feedback transistor, said first current mirror further including a second PNP mirror transistor having an emitter terminal coupled to said first voltage terminal, a collector terminal coupled to said emitter terminal of said PNP common base feedback transistor, and a base terminal, and a third PNP mirror transistor having an emitter terminal coupled to said first voltage terminal, a collector terminal coupled to said emitter terminal of said first PNP mirror transistor, and a base terminal commonly coupled to said collector terminal of said third PNP mirror transistor and to said base of said second PNP mirror transistor; and a second current mirror that includes a NPN common base feedback transistor having an emitter terminal coupled to said base terminal of said NPN output transistor, a collector terminal coupled to said base terminal of said PNP output transistor, and a base terminal coupled to a constant current source, said second current mirror further including a first NPN mirror transistor having an emitter terminal, a collector terminal coupled to said constant current source, and a base terminal commonly coupled to said collector terminal of said first NPN mirror transistor and to said base terminal of said NPN common base feedback transistor, said second current mirror further including a second NPN current mirror transistor having an emitter terminal coupled to said second voltage terminal, a collector terminal coupled to said emitter terminal of said NPN common base feedback transistor, and a base terminal, and a third NPN current mirror transistor having an emitter terminal coupled to said second voltage terminal, a collector terminal coupled to said emitter terminal of said first NPN current mirror transistor, and a base terminal commonly coupled to said collector terminal of said third NPN current mirror transistor and to said base terminal of said second NPN current mirror transistor.

5. A method of providing a complementary bipolar class AB output stage circuit, said method comprising the steps of:

providing an input terminal configured to receive an input signal;

providing an output terminal for coupling to a load;

providing first and second voltage terminals for coupling to first and second fixed voltage, respectively;

providing a PNP output transistor having an emitter terminal coupled to said first voltage terminal, a collector terminal coupled to said output terminal, and a base terminal coupled to a constant current source;

providing a NPN output transistor having an emitter terminal coupled to said second voltage terminal, a collector terminal coupled to said output terminal, and a base terminal coupled to a constant current sink;

providing a NPN buffer transistor having a collector terminal coupled to said base terminal of said PNP output transistor, an emitter terminal coupled to said output terminal, and a base terminal;

providing a PNP buffer transistor having a collector terminal coupled to said base terminal of said NPN output transistor, an emitter terminal coupled to said output terminal, and a base terminal;

providing means for coupling the input terminal to the base terminal of said NPN buffer transistor and to the base terminal of said PNP buffer transistor;

providing a PNP common base feedback transistor having an emitter terminal coupled to said base terminal of said PNP output transistor, a collector terminal coupled to said base terminal of said NPN output transistor, and a base terminal coupled to a first source of bias voltage less than said first fixed voltage; and providing a NPN common base feedback transistor having an emitter terminal coupled to said base terminal of said NPN output transistor, a collector terminal coupled to said base terminal of said PNP output transistor, and a base terminal coupled to a second source of bias voltage greater than said second fixed voltage.

6. A method of providing a complementary bipolar class AB output stage circuit, said method comprising the steps of:

providing an input terminal configured to receive an input signal;

providing an output terminal configured for coupling to a load;

providing first and second voltage terminals configured for coupling to first and second fixed voltages, respectively;

providing a PNP output transistor having an emitter terminal coupled to said first voltage terminal, a collector terminal coupled to said output terminal, and a base terminal;

providing a NPN output transistor having an emitter terminal coupled to said second voltage terminal, a collector terminal coupled to said output terminal, and a base terminal;

providing a NPN buffer transistor having a collector terminal coupled to said base terminal of said PNP output transistor, an emitter terminal coupled to said output terminal, and a base terminal;

providing a PNP buffer transistor having a collector terminal coupled to said base terminal of said NPN output transistor, an emitter terminal coupled to said output terminal, and a base terminal;

providing means for coupling said input terminal to said base terminal of said NPN buffer transistor and to said base terminal of said PNP buffer transistor;

providing a first current mirror that includes a PNP common base feedback transistor having an emitter terminal coupled to said base terminal of said PNP output transistor, a collector terminal coupled to said base terminal of said NPN output transistor, and a base terminal coupled to a constant current sink, said first current mirror further including a first PNP mirror transistor having an emitter terminal, a collector terminal coupled to said constant current sink, and a base terminal commonly coupled to said collector terminal of said first PNP mirror transistor and to said base terminal of said PNP common base feedback transistor, a second PNP mirror transistor having an emitter terminal coupled to said first voltage terminal, a collector terminal coupled to said emitter terminal of the PNP common base feedback transistor, and a base terminal, and a third PNP mirror transistor having an emitter terminal coupled to said first voltage terminal, a collector terminal coupled to said emitter terminal of said first PNP mirror transistor, and a base terminal commonly coupled to said collector terminal of said third PNP mirror transistor and to said base terminal of said second PNP mirror transistor; and providing a second current mirror that includes a NPN common base feedback transistor having an emitter terminal coupled to said base terminal of said NPN output transistor, a collector terminal coupled to said base terminal of said PNP output transistor, and a base terminal coupled to a constant current source, said second current mirror further including a first NPN mirror transistor having an emitter terminal, a collector terminal coupled to said constant current source, and a base terminal commonly coupled to said collector terminal of said first NPN mirror transistor and to said base terminal of said NPN common base feedback transistor, a second NPN current mirror transistor having an emitter terminal coupled to said second voltage terminal, a collector terminal coupled to said emitter terminal of said NPN common base feedback transistor, and a base terminal, and a third NPN current mirror transistor having an emitter terminal coupled to said second voltage terminal, a collector terminal coupled to said emitter terminal of said first NPN current mirror transistor, and a base terminal commonly coupled to said collector terminal of said third NPN current mirror transistor and to said base terminal of said second NPN current mirror transistor.

* * * * *